(12) United States Patent
Basker et al.

(10) Patent No.: US 9,577,099 B2
(45) Date of Patent: Feb. 21, 2017

(54) DIAMOND SHAPED SOURCE DRAIN EPITAXY WITH UNDERLYING BUFFER LAYER

(71) Applicant: GLOBALFOUNDRIES Inc., Grand Cayman (KY)

(72) Inventors: Veeraraghavan S. Basker, Schenectady, NY (US); Eric C. T. Harley, Lagrangeville, NY (US); Yue Ke, Fishkill, NY (US); Alexander Reznicek, Troy, NY (US); Henry K. Utomo, Newburgh, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/641,917

(22) Filed: Mar. 9, 2015

(65) Prior Publication Data

US 2016/0268413 A1    Sep. 15, 2016

(51) Int. Cl.
| H01L 29/00 | (2006.01) |
| H01L 21/00 | (2006.01) |
| H01L 29/78 | (2006.01) |
| H01L 29/66 | (2006.01) |
| H01L 29/06 | (2006.01) |
| H01L 29/08 | (2006.01) |
| H01L 29/04 | (2006.01) |
| H01L 29/45 | (2006.01) |
| H01L 21/306 | (2006.01) |

(52) U.S. Cl.
CPC .......... *H01L 29/785* (2013.01); *H01L 29/045* (2013.01); *H01L 29/0649* (2013.01); *H01L 29/0847* (2013.01); *H01L 29/45* (2013.01); *H01L 29/66795* (2013.01); *H01L 29/7851* (2013.01); *H01L 21/30604* (2013.01)

(58) Field of Classification Search
CPC .... H01L 29/785; H01L 29/0649; H01L 29/45; H01L 29/045; H01L 29/7851; H01L 29/0847; H01L 29/66795; H01L 21/30604
See application file for complete search history.

(56) References Cited

U.S. PATENT DOCUMENTS

| 7,622,773 | B2* | 11/2009 | Irisawa | H01L 29/78687 257/347 |
| 7,915,693 | B2* | 3/2011 | Okano | H01L 29/66795 257/329 |
| 8,263,451 | B2* | 9/2012 | Su | H01L 29/785 257/190 |
| 8,441,072 | B2* | 5/2013 | Tsai | H01L 29/66795 257/347 |
| 8,592,290 | B1 | 11/2013 | Basker et al. | |
| 8,729,607 | B2 | 5/2014 | Itokawa et al. | |

(Continued)

*Primary Examiner* — Nikolay Yushin
(74) *Attorney, Agent, or Firm* — Yuanmin Cai; Andrew M. Calderon; Roberts Mlotkowski Safran Cole & Calderon, P.C.

(57) ABSTRACT

A semiconductor structure includes a fin upon a semiconductor substrate. A clean epitaxial growth surface is provided by forming a buffer layer upon fin sidewalls and an upper surface of the fin. The buffer layer may be epitaxially grown. Diamond shaped epitaxy is grown from the buffer layer sidewalls. In some implementations, the diamond shaped epitaxy may be subsequently merged with surrounding dielectric. A dopant concentration of the surrounding dielectric may be higher than a dopant concentration of the diamond shaped epitaxy.

17 Claims, 5 Drawing Sheets

(56) References Cited

U.S. PATENT DOCUMENTS

| | | |
|---|---|---|
| 8,796,695 B2 | 8/2014 | Liao et al. |
| 8,815,670 B2 | 8/2014 | Basker et al. |
| 9,312,179 B2* | 4/2016 | Lin ................. H01L 21/823412 |
| 2007/0241399 A1* | 10/2007 | Irisawa ............. H01L 29/66795 |
| | | 257/347 |
| 2008/0003755 A1* | 1/2008 | Shah ................. H01L 29/66628 |
| | | 438/300 |
| 2011/0210404 A1* | 9/2011 | Su ........................ H01L 29/785 |
| | | 257/401 |
| 2011/0227162 A1* | 9/2011 | Lin ................. H01L 21/823412 |
| | | 257/368 |
| 2013/0056827 A1* | 3/2013 | Tsai ................. H01L 29/66795 |
| | | 257/347 |
| 2013/0234215 A1* | 9/2013 | Okano ............. H01L 29/42392 |
| | | 257/255 |
| 2014/0027863 A1 | 1/2014 | Adam et al. |
| 2015/0228761 A1* | 8/2015 | Cheng ............. H01L 29/66795 |
| | | 257/365 |

* cited by examiner

DIAMOND SHAPED SOURCE DRAIN EPITAXY WITH UNDERLYING BUFFER LAYER

FIELD

Embodiments of invention generally relate to semiconductor devices, design structures for designing a semiconductor device, and semiconductor device fabrication methods. More particularly, embodiments relate to semiconductor structures with diamond epitaxy grown from repaired fins.

BACKGROUND

Current pre-epitaxy processing of epitaxial seed fin surfaces may results in fin damage. Particularly, long pre-epitaxy processing with high boron dopant gas may lead to subsequent nodule formation upon fin surfaces. For instance, pure boron may be deposited around the damaged fin which may lead to epitaxial growth delay and device shorting due to excessive boron dopant near the channel.

SUMMARY

In a first embodiment of the present invention, a semiconductor device fabrication method includes forming a fin upon a semiconductor substrate the fin having sidewalls and an upper surface, forming a buffer layer upon the sidewalls and upper surface, and forming diamond shaped epitaxy upon the buffer layer.

In another embodiment of the present invention, a semiconductor device includes a fin upon a semiconductor substrate, the fin having fin sidewalls and an fin upper surface, a buffer layer upon the fin sidewalls and fin upper surface, and diamond shaped first dielectric surrounding the buffer layer.

In yet another embodiment, the semiconductor device is included in a design structure embodied in a machine readable storage medium for designing, manufacturing, or testing an integrated circuit.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments relate to semiconductor structures with diamond epitaxy grown from a repaired fin. A buffer layer is formed around the fin to repair incoming fin damage and provide seed layer for diamond epitaxy growth. In some embodiments, the diamond epitaxy may be subsequently epitaxially merged. The semiconductor structure includes the fin formed upon a substrate and a gate formed upon the substrate and upon the fin covering a portion of the fin. The portion of the fin covered by the gate may serve as a channel region of the semiconductor device. Portions of the fin extend out from under the gate and may serve as source and drain regions of the device.

Referring now to the FIGs., exemplary process steps of forming a structure 10 in accordance with embodiments of the present invention are shown, and will now be described in greater detail below. It should be noted that some of the figures depict a cross section view of structure 10. Furthermore, it should be noted that while this description may refer to some components of the structure 10 in the singular tense, more than one component may be depicted throughout the figures and like components are labeled with like numerals. The specific number of components depicted in the figures and the cross section orientation was chosen for illustrative purposes only.

Figure 1:
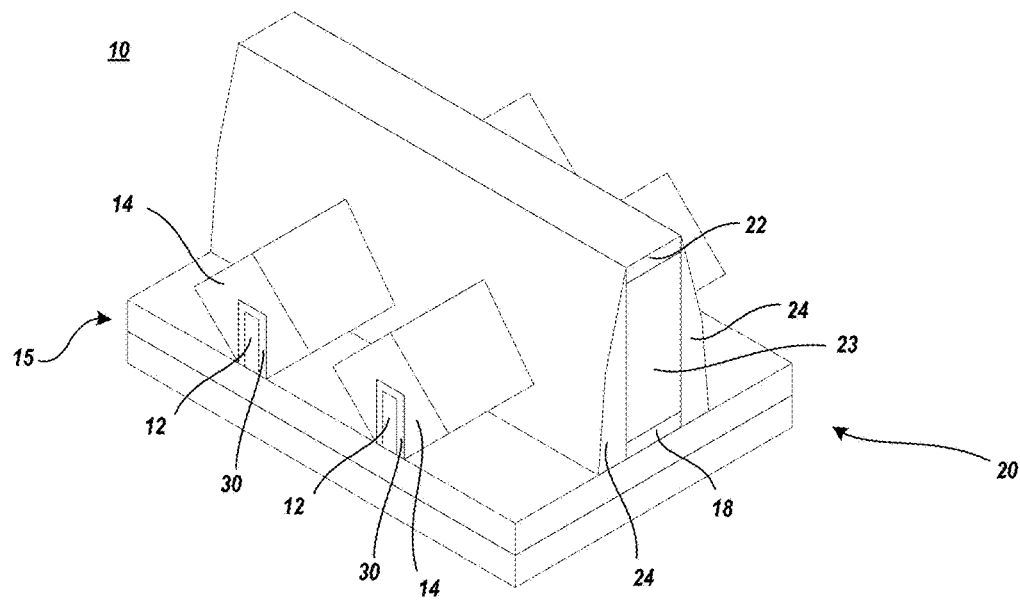
FIG. 1 depicts an isometric view of a semiconductor structure at an intermediate stage of semiconductor device fabrication, in accordance with various embodiments of the present invention.

FIG. 1 depicts an isometric view of semiconductor structure 10 at an intermediate stage of semiconductor device fabrication. Semiconductor structure 10 includes a substrate 15. Substrate 15 may be a layered substrate, a bulk substrate, etc. Fins 12 are formed upon substrate 15. A gate 20 is formed upon substrate 15 generally orthogonal to fins 12. The fins 12 are repaired by forming a buffer layer 30 thereupon. Diamond shaped epitaxy 14 is grown from buffer layer 30.

Substrate 15 may be a layered semiconductor substrate such as Si/SiGe substrate, a silicon-on-insulator (SOI) substrate, a SiGe-on-insulator (SGOI) substrate, etc. Substrate 15 may further be a bulk semiconductor substrate such as an undoped Si substrate, n-doped Si substrate, p-doped Si substrate, single crystal Si substrate, polycrystalline Si substrate, amorphous Si substrate, Ge substrate, SiGe substrate, SiC substrate, SiGeC substrate, GaAs substrate, InAs substrate, InP substrate, etc. When substrate 15 is a bulk substrate, the fin 12 may be etched from the substrate 15.

When substrate 15 is a layered substrate it includes a base substrate, a buried dielectric layer formed upon of the base substrate, and a SOI layer formed on top of the buried dielectric layer. The buried dielectric layer may isolate the SOI layer from the base substrate. The plurality of fin 12 may be etched from the SOI layer. The base substrate may be made from any of several known semiconductor materials such as, for example, Si, Ge, SiGe, SiC, SiGeC, or other similar semiconductor materials. Non-limiting examples of compound semiconductor materials include GaAs, InAs, InP, etc. Typically the base substrate may be about, but is not limited to, several hundred microns thick. For example, the base substrate may have a thickness ranging from 0.5 mm to about 1.5 mm.

The buried dielectric layer may include any of several dielectric materials, for example, oxides, nitrides and oxynitrides of silicon. The buried dielectric layer may also include oxides, nitrides and oxynitrides of elements other than silicon. In addition, the buried dielectric layer may include crystalline or non-crystalline dielectric material. Moreover, the buried dielectric layer may be formed using any of several known methods, for example, thermal or plasma oxidation or nitridation methods, chemical vapor deposition methods, and physical vapor deposition methods. The buried dielectric layer may have a thickness ranging from about 5 nm to about 200 nm. In one embodiment, the buried dielectric layer may have a thickness ranging from about 120 nm to about 180 nm.

The SOI layer may include any of the several semiconductor materials included in the base substrate. In general, the base substrate and the SOI layer may include either identical or different semiconducting materials with respect to chemical composition, dopant concentration and crystallographic orientation. The base substrate and the SOI layer may include semiconducting materials that include at least different crystallographic orientations. Typically, the SOI layer may include a thickness ranging from about 5 nm to about 100 nm. In one embodiment, the SOI layer may have a thickness ranging from about 25 nm to about 60 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that fins 12 may be etched from the SOI layer. Because the plurality of fins may be etched from the SOI layer, they too may include any of the characteristics listed above for the SOI layer.

When substrate 15 is a bulk substrate, fins 12 may be etched from the bulk substrate. Dielectric portions may then be formed between fins and may include any of several dielectric materials, for example, oxides, nitrides and oxynitrides of silicon. The dielectric portions may also include oxides, nitrides and oxynitrides of elements other than silicon. In addition, the dielectric portions may include crystalline or non-crystalline dielectric material. Moreover, the dielectric portions may be formed using any of several known methods, for example, chemical vapor deposition methods, and physical vapor deposition methods.

Semiconductor structure 10 also includes a gate 20. Gate 20 may include a gate dielectric 18, gate material 23, a gate cap 22, and spacers 24. Generally, gate 20 may be formed by using widely known techniques. For example, gate 20 may be formed by first providing a gate dielectric 18 layer upon substrate 15 and upon fins 12 utilizing a conventional deposition process including, for example, chemical vapor deposition, plasma enhanced chemical vapor deposition or chemical solution deposition. A gate material 23 may be formed upon gate dielectric 18, and a gate cap 22 formed upon gate material 23. The gate dielectric 18, gate material 23, and gate cap 22 may then patterned by lithography and etched to form a gate stack. In certain embodiments, spacers 24 may be formed on the sides of gate stack. Generally, gate stack may be formed by other known processes without deviating from the spirit of those embodiments herein claimed.

Semiconductor structures 10 may also include buffer layer 30 formed upon fin 12. Buffer layer 30 may be epitaxially grown from fin 12 surface(s). Buffer layer 30 may repair fin 12 and provide a seed surface for the growth of diamond shaped epitaxy 14. Generally, expitaxial growth, grown, deposition, formation, etc. means the growth of a semiconductor material on a deposition or seed surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects, film cracking, etc.

Semiconductor structure 10 may be fabricated by a "gate first" process or a "gate last" process. In a gate first process, gate 20 structures are formed followed by subsequent fabrication processing such as forming of the source and drain, forming spacers, depositing of the interlevel dielectric, etc. In a gate last process, a dummy gate structure is formed followed by typical fabrication processing. Thereafter, the dummy gate structure is removed followed by fabrication of a replacement gate 20.

Figure 2A:
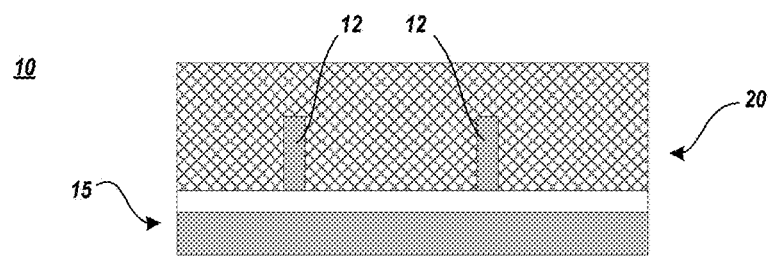
FIG. 2A and FIG. 2B depict a cross section view of a semiconductor structure at an intermediate stage of semiconductor device fabrication, in accordance with various embodiments of the present invention.
Figure 2B:
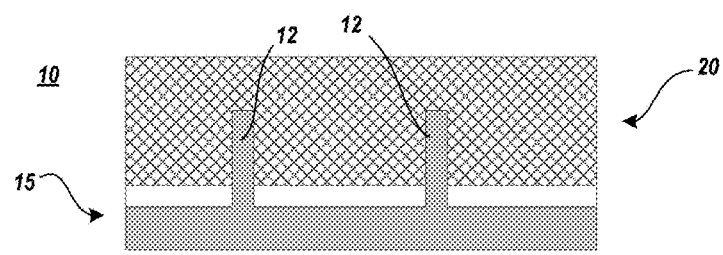

FIG. 2A and FIG. 2B depict a cross section views of semiconductor structures 10 at an intermediate stage of semiconductor device fabrication, in accordance with various embodiments of the present invention. FIG. 2A depicts semiconductor structure 10 when substrate 15 is a layered substrate. FIG. 2B depicts semiconductor structure when substrate 15 is a bulk substrate. For clarity, semiconductor structure 10 is shown subsequently when substrate 15 is a layered substrate, though structure 10 may alternatively include substrate 15 as a bulk substrate.

At the present stage of fabrication, fins 12 and gate 20 are formed upon semiconductor structure 10. As shown in FIG. 2A, the layered substrate 15 may include the base substrate and the buried dielectric layer formed on top of the base substrate. A SOI layer (not shown) is formed on top of the buried dielectric layer. The buried dielectric layer may isolate the SOI layer from the base substrate. A plurality of fins 12 may be etched from the SOI layer. As shown in FIG. 2B, the bulk substrate 15 may include a base substrate. Fins 12 may be etched from base substrate. Dielectric portions may then be formed between fins 12. In certain embodiments, dielectric portions may be etched or recessed following their formation. Generally, fins 12 may be formed upon a semiconductor structure 10 by other known processes or techniques without deviating from the spirit of those embodiments herein claimed.

Gate 20 may also be formed upon semiconductor structure 10. In certain embodiments, a gate dielectric 18 layer is formed atop semiconductor structure 10 (i.e. upon substrate 15 and fins 12) generally orthogonal to fins 12 utilizing a conventional deposition process including, for example, chemical vapor deposition, plasma enhanced chemical vapor deposition or chemical solution deposition. A layer of gate material 23 may be formed upon gate dielectric 18, and a gate cap 22 formed upon gate material 23. The layers may then patterned by lithography and etched to form a gate stack. In certain embodiments, spacers 24 may be formed on the sides of gate stack. Generally, gate stack 16 may be formed by other known processes without deviating from the spirit of those embodiments herein claimed.

Figure 3:
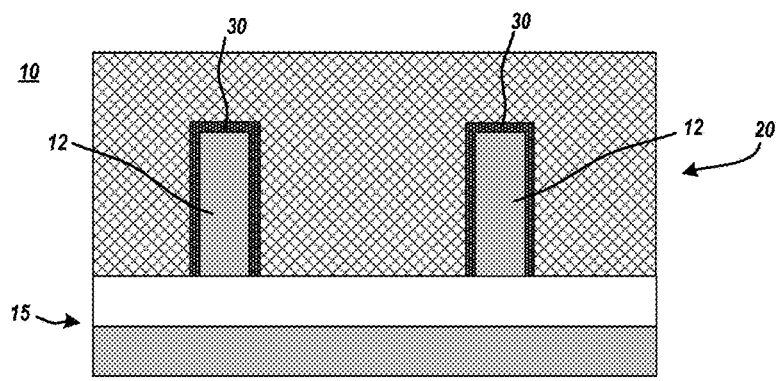
FIG. 3 depicts a cross section view of a semiconductor structure depicting diamond epitaxy planes, in accordance with various embodiments of the present invention.

FIG. 3 depicts a cross section view of a semiconductor structure 10 at an intermediate stage of semiconductor device fabrication, in accordance with various embodiments of the present invention. At this stage of fabrication, buffer layer 30 is formed upon structure 10. More specifically, buffer layer 30 is epitaxially grown from fins 12. Substrate 15 and fin 12 upper surface have a <100> orientation and fin 12 sidewalls have a <110> orientation. Material is epitaxially grown off the fin 12 sidewalls and fin 12 upper surface. As, epitaxial growth from the <100> orientation is relatively quicker, the height of buffer layer 30 from fin 12 upper surface may be greater than the width of buffer layer 30 from fin 12 sidewalls.

A non limiting list of buffer layer 30 exemplary epitaxial materials are: silicon germanium alloy (SiGe), Silicon (Si), in-situ boron doped SiGe or Si, in situ phosphorus or arsenic doped Si or SiGe, with doping levels ranging from 1e19 to 1.5e21, with 2-4e20 dopant levels preferred.

Generally, fins buffer layer 30 may be formed upon a semiconductor structure 10 by other known processes or techniques without deviating from the spirit of those embodiments herein claimed. For example, buffer layer 30 may be formed utilizing conventional deposition process including, for example, chemical vapor deposition, plasma enhanced chemical vapor deposition or chemical solution deposition followed by etch processing, etc.

Figure 4:
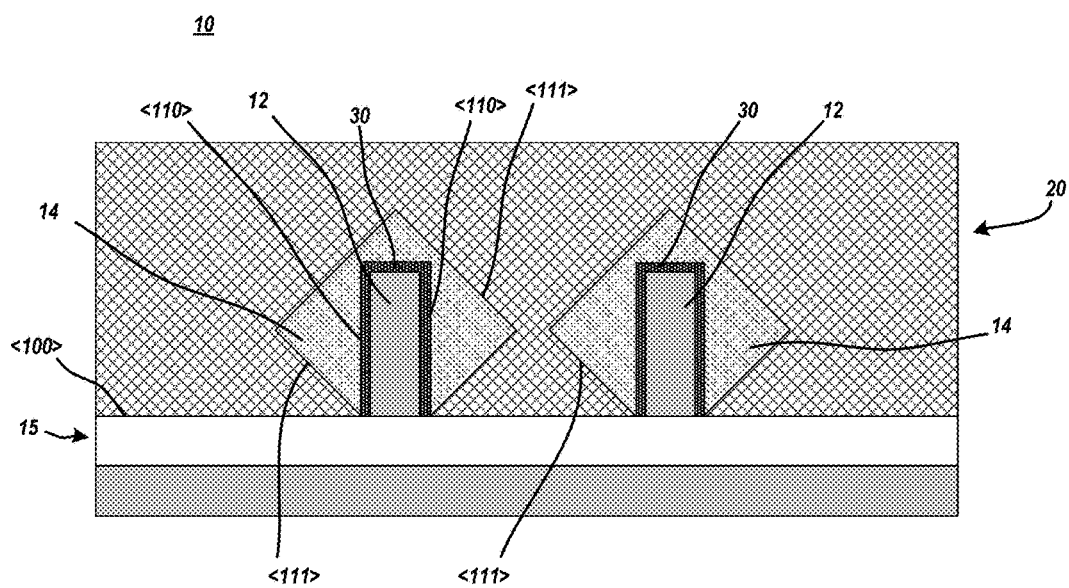
FIG. 4-FIG. 6 depict cross section views of a semiconductor structure at an intermediate stages of semiconductor device fabrication, in accordance with various embodiments of the present invention.

FIG. 4 depicts a cross section view of a semiconductor structure 10 at an intermediate stage of semiconductor device fabrication, in accordance with various embodiments of the present invention. At this stage of fabrication, pre-merge diamond shaped epitaxy 14 is formed upon semiconductor structure 10. More specifically, pre-merge diamond shaped epitaxy 14 is epitaxially grown upon buffer layer 30. Buffer layer 30 sidewalls have a <110> orientation. Epitaxy is grown off the buffer layer 30 sidewalls and a diamond structure is formed around fins 12. Upon growing from <110> orientation, buffer layer 30 sidewalls, the diamond shaped structure will have outer <111> plane. The epitaxial growth of diamond shaped epitaxy 14 is self-limiting to the outer <111> plane resulting in diamond outer periphery.

A non limiting list of diamond shaped epitaxy 14 exemplary epitaxial materials are: silicon germanium alloy (SiGe), Silicon (Si), in-situ boron doped SiGe or Si, in situ phosphorus or arsenic doped Si or SiGe, with doping levels ranging from 1e19 to 1.5e21, with 2-8e20 dopant levels preferred.

Figure 5:
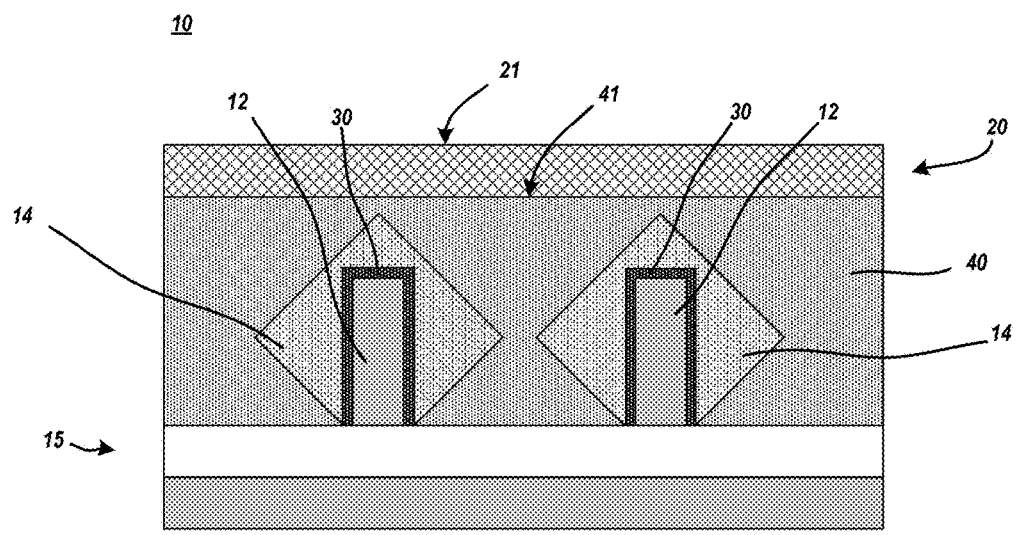

FIG. 5 depicts a cross section view of a semiconductor structure 10 at an intermediate stage of semiconductor device fabrication, in accordance with various embodiments of the present invention. At this stage of fabrication, pre-merge diamond epitaxy 14 is merged by overgrowth 40 upon semiconductor structure 10. Overgrowth 40 may be formed from by epitaxial growth. More specifically, overgrowth 40 is epitaxially grown from the <111> planes of the diamond shaped epitaxy. Once the slow epitaxial growth off the <111> bound diamond shaped epitaxy 14 leads to merge of two neighboring structures, a (100) planes is formed between the two touching diamond structures and the epitaxial growth accelerates there and leads to further merge and overgrowth 40. In certain embodiments overgrowth 40 is formed to a height above diamond epitaxy 14 and below top surface 21 of gate 20. A top surface 41 of overgrowth 40 may generally be parallel to substrate 15. Overgrowth 40 may be epitaxially grown on both the source and drain sides of gate 20.

A non limiting list of overgrowth 40 exemplary expitaxial materials are: silicon germanium alloy (SiGe), Silicon (Si), in-situ boron doped SiGe or Si, in situ phosphorus or arsenic doped Si or SiGe, with doping levels ranging from 1e19 to 1.5e21, with 4e20 to 1e21 dopant levels preferred.

Generally, overgrowth 40 may be formed upon a semiconductor structure 10 by other known processes or techniques without deviating from the spirit of those embodiments herein claimed. For example, overgrowth 40 may be formed utilizing conventional deposition process including, for example, chemical vapor deposition, plasma enhanced chemical vapor deposition or chemical solution deposition followed by etch processing, etc.

Figure 6:
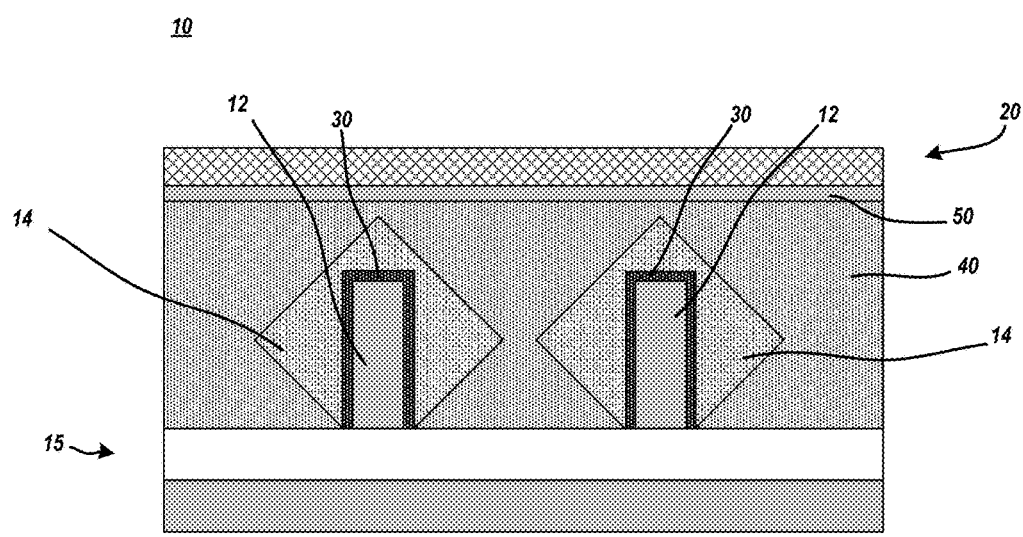

FIG. 6 depicts a cross section view of a semiconductor structure 10 at an intermediate stage of semiconductor device fabrication, in accordance with various embodiments of the present invention. At this stage of fabrication, sacrificial cap 50 is formed upon semiconductor structure 10. Sacrificial cap 50 is a dielectric layer may include any of several dielectric materials, for example, oxides, nitrides and oxynitrides of silicon, etc. that may be consumed during subsequent silicide formation. Sacrificial cap 50 may be formed utilizing conventional deposition process including, for example, chemical vapor deposition, plasma enhanced chemical vapor deposition or chemical solution deposition followed by etch processing, etc.

For clarity, structure 10 as shown in FIG. 5 or FIG. 6, may undergo further fabrication steps that may add or remove layers, materials, etc. in further front end of line, middle end of (MEOL) line, or back end of line fabrication steps to form a semiconductor device. For example, MEOL dielectric layer may be formed upon structure 10, contact trenches may be formed in the MEOL dielectric layer, and contacts formed within the trenches utilizing conventional fabrication techniques.

The various embodiments described herein offer potential advantages. Particularly, the buffer layer 30 around fin 12 may repair incoming fin damage and provide a clean seed surface for diamond shaped epitaxy 14 formation. The dopant concentration of diamond shaped epitaxy 14 may serve as the device junction and the dopant concentration thereof may be tuned for beneficial junction formation and reduced risk of shorting or swapping. The concentration of dopant in overgrowth 40 may likewise be tuned for beneficial silicide, contact, etc. formation. In other words, the dopant concentration of epitaxy 14 may be lower to achieve junction formation benefits while the dopant concentration overgrowth 40 may be higher to achieve silicide formation benefits.

Figure 7:
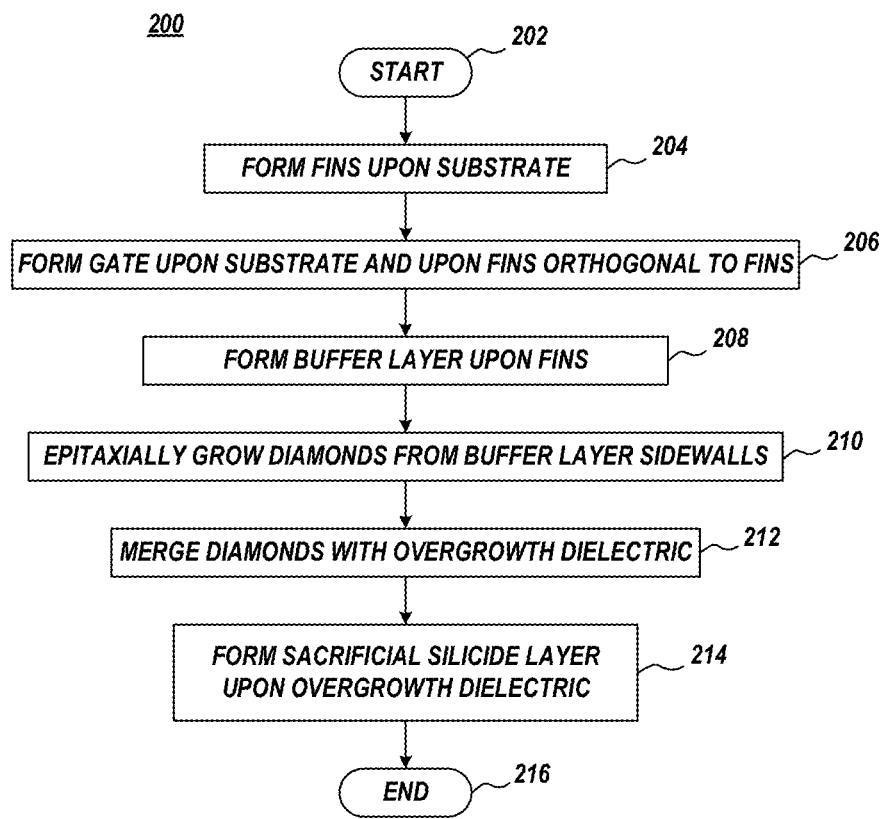
FIG. 7 depicts an exemplary semiconductor device fabrication process flow, in accordance with various embodiments of the present invention.

FIG. 7 depicts an exemplary process flow 200 for fabricating a semiconductor device, in accordance with various embodiments of the present invention. Process 200 begins at block 202 and continues by forming fins 12 upon a substrate 15 (block 204). Method 200 may continue by forming a gate 20 upon the substrate 15 and upon the fins 12 (block 206). The gate 20 may be formed generally orthogonal to fins 12.

Method 200 may continue by forming buffer layer 30 upon fin 12 sidewalls and fin 12 upper surface (block 208). Buffer layer 30 may be epitaxially grown from fin 12 sidewalls and fin 12 upper surface. Method 200 may continue by forming diamond shaped epitaxy 14 on buffer layer 30 (block 210). For example, SiGe epitaxy is grown off the <110> buffer layer 20 sidewalls. The outer boundary of diamond shaped epitaxy 14 forms a <111> planar boundary.

Method 200 may continue by merging diamond shaped epitaxy 14 with overgrowth 40 (block 212). For example, overgrowth 40 may be epitaxially grown from <111> planar boundary of diamond shaped epitaxy 14. A dopant concentration of overgrowth 40 may be relatively higher than a dopant concentration of diamond shaped epitaxy 14. Method 200 may continue with forming a sacrificial cap 50 upon overgrowth 40 (block 214). Method 200 ends at block 216.

Figure 8:
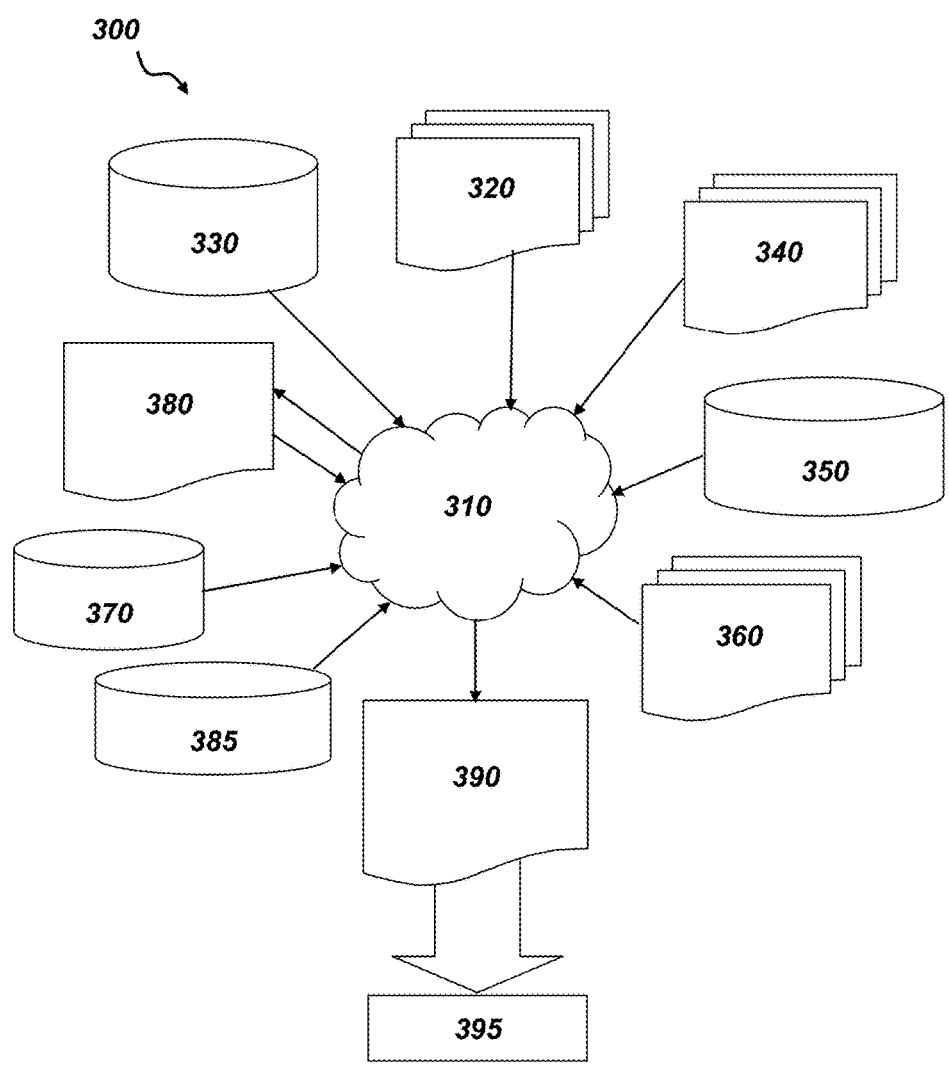
FIG. 8 depicts a flow diagram of a design process used in semiconductor design, manufacture, and/or test, in accordance with various embodiments of the present invention.

Referring now to FIG. 8, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-6.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-6. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-6 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 390 may comprise a compiled, executable HDL simulation model that functionally simulates the devices shown in FIGS. 1-6.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 390 may then proceed to a stage 395 where, for example, design structure 390: proceeds to tape-out, is released to manufacturing, is released to a mask house, is sent to another design house, is sent back to the customer, etc.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above may be used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

The invention claimed is:

1. A semiconductor device fabrication method comprising:
    forming a fin upon a semiconductor substrate, the tin comprising sidewalls and upper surface;
    forming a buffer layer upon the sidewalls and upper surface, and;
    forming diamond shaped epitaxy upon the buffer layer, wherein the sidewalls of the fin are vertical;
    the upper surface of the fin is horizontal;
    the buffer layer comprises one of doped Si and doped SiGe; and
    the diamond shaped epitaxy comprises an apex over the upper surface of the fin; and
    further comprising epitaxially growing epitaxy overgrowth from the diamond shaped epitaxy, wherein the epitaxy overgrowth is formed to a height above the apex of the diamond shaped epitaxy and below a top surface of a gate.

2. The semiconductor device fabrication method of claim 1, further comprising:
    merging the diamond shaped epitaxy.

3. The method of claim 1, wherein forming diamond shaped epitaxy further comprises:
    forming a <111> planar boundary, the <111> planar boundary generally diamond shaped.

4. The method of claim 1, wherein merging the diamond shaped epitaxy further comprises:
    forming epitaxy overgrowth from the diamond shaped epitaxy.

5. The method of claim 4, wherein a dopant concentration of the epitaxy overgrowth is higher relative to a dopant concentration of the diamond shaped epitaxy.

6. The method of claim 4, further comprising:
    forming a sacrificial silicide layer upon the epitaxy overgrowth.

7. The method of claim 1, wherein forming diamond shaped epitaxy upon the buffer layer further comprises:
    forming diamond shaped epitaxy on <110> planes of the buffer layer sidewalls.

8. The method of claim 1, wherein the semiconductor substrate is a layered substrate and the fin is formed by etching portions of a silicon-on-insulator layer of the layered substrate.

9. The method of claim 1, wherein the semiconductor substrate is a bulk substrate and the fin is formed by etching portions of the bulk substrate.

10. The method of claim 1, further comprising:
    forming a gate upon the substrate generally orthogonal to the fin.

11. The method of claim 1, wherein:
    the forming the buffer layer comprises epitaxially growing the buffer layer from the fin;
    the forming the diamond shaped epitaxy comprises epitaxially growing the diamond shaped epitaxy upon the buffer layer; and
    further comprising epitaxially growing epitaxy overgrowth from <111> planes of the diamond shaped epitaxy.

12. A semiconductor device comprising:
    a fin upon a semiconductor substrate, the fin comprising fin sidewalls and fin upper surface;
    a buffer layer upon the fin sidewalls and fin upper surface;
    diamond shaped first dielectric surrounding the buffer layer;
    a second dielectric upon the substrate surrounding the diamond shaped first dielectric; and
    a sacrificial silicide layer upon the second dielectric.

13. The semiconductor device of claim 12, wherein a dopant concentration of the second dielectric is higher relative to a dopant concentration of the diamond shaped first dielectric.

14. The semiconductor device of claim 12, wherein the semiconductor substrate is a layered substrate.

15. The semiconductor device of claim 12, wherein the semiconductor substrate is a bulk substrate.

16. The semiconductor device of claim 12, further comprising: a gate upon the substrate orthogonal to the fin.

17. A design structure embodied in a machine readable storage medium for designing, manufacturing, or testing an integrated circuit, the design structure comprising:
    a fin upon a semiconductor substrate, the fin comprising fin sidewalls and fin upper surface;
    a buffer layer upon the fin sidewalls and fin upper surface;
    diamond shaped first dielectric surrounding the buffer layer; and
    second dielectric upon the substrate surrounding the diamond shaped first dielectric,
    wherein a dopant concentration of the second dielectric is higher relative to a dopant concentration of the diamond shaped first dielectric.

* * * * *